United States Patent [19]
Joshi et al.
[11] 3,711,341
[45] Jan. 16, 1973

[54] METHOD OF MAKING SINTERED METAL ULTRASONIC BONDING TIPS

[75] Inventors: Kailash C. Joshi, Johnson City; Franklin F. M. Lee, Endwell, both of N.Y.

[73] Assignee: International Business Machines Corporation, Armonk, N.Y.

[22] Filed: May 4, 1970

[21] Appl. No.: 33,998

[52] U.S. Cl. ......................148/126, 75/211, 75/225, 288/1

[51] Int. Cl. ................................................B22f 1/00

[58] Field of Search ........148/126; 75/200, 211, 225; 29/182; 228/470.1, 1

[56] References Cited

UNITED STATES PATENTS

| | | | |
|---|---|---|---|
| 3,426,951 | 2/1969 | Pohlman et al | 228/1 |
| 3,303,066 | 2/1967 | McGee | 148/126 |
| 3,522,115 | 7/1970 | McGee et al. | 148/126 |
| 3,471,343 | 10/1969 | Koehler | 148/126 |

*Primary Examiner*—Benjamin R. Padgett
*Assistant Examiner*—B. H. Hunt
*Attorney*—Hanifin and Jancin and Charles S. Neave

[57] ABSTRACT

An ultrasonic bonding tip fabricated of sintered metal, preferably stainless steel. The tips are particularly useful in the bonding of wire and ultrafine wires to other conductive metal surfaces. The general method consists of compacting stainless steel powders and heating the compact in air at 1000° F for 20 minutes. The compact is then sintered in dissociated ammonia at 2000°–2350° F for one hour. The bodies are repressed and heated at 1500°–2000° F in an endo-thermal atmosphere followed by air cooling. The tips are then tempered and ground to final size. Optionally, they may be finally dipped in acid baths.

2 Claims, 6 Drawing Figures

INVENTORS
KAILASH C. JOSHI
FRANKLIN F. M. LEE
BY [signature]
AGENT

METHOD OF MAKING SINTERED METAL ULTRASONIC BONDING TIPS

BACKGROUND OF THE INVENTION

1. Field of the Invention

This invention relates to the process for fabricating ultrasonic bonding tips and to unique tips produced by the process.

2. Description of the Prior Art

In known devices for the ultrasonic bonding of wire to conductive metal pad surfaces, the bonding tip is generally arranged to vibrate parallel to the pad surface. Experimentation has shown that good bonds are obtained when the relative motion between the bonding tip and wire is minimized. Further, the improvements after sand blasting and aluminization of sapphire tips and the success of ceramic tips all tend toward one thing, namely, that clamping efficiency accompanied by minimum deformation is the major requirement insofar as the bonding tip quality and durability are concerned. Consequently, if a uniform surface roughness of a bonding tip can be maintained, the quality of the bonds and efficiency of the bond formations can be greatly enhanced. Briefly, the success of ultrasonic wire bonding is dependent upon the efficiency of tip-to-wire coupling. Sapphire, tungsten carbide and alumina ceramic have been used for tip materials with some success. However, sapphire and ceramic tips are too fragile and tungsten carbide, due to the depletion of binder material, wears off rapidly.

SUMMARY OF THE INVENTION

It is a primary object of the invention to provide an ultrasonic bonding tip and device by means of which fine or superfine wire can be bonded to metallic surfaces to form good electrical interconnections. The present invention provides ultrasonic bonding tips of sintered metals which have good toughness and uniformly porous surface characteristics and that are adapted to engage with fine or superfine wire in an efficient manner to effect quality bonds.

The foregoing and other objects, features and advantages of the invention will be apparent from the following more particular description of preferred embodiments of the invention, as illustrated in the accompanying drawings.

DESCRIPTION OF THE PREFERRED EMBODIMENTS

Figure 1:
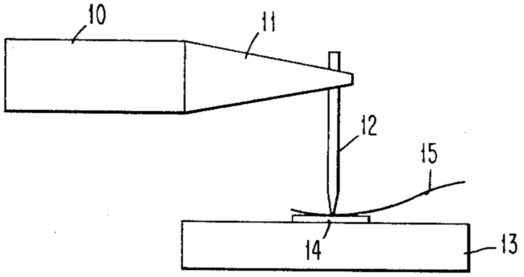
FIG. 1 is an elevational view of the ultrasonic transducer, the bonding tip and the horn.
Figure 2:
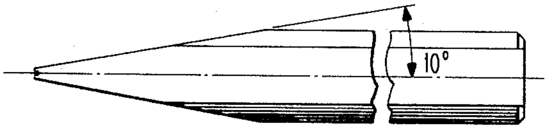
FIG. 2 is a front view of the bonding tip.
Figure 3:
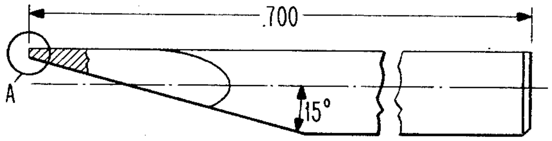
FIG. 3 is a side view of the bonding tip.
Figure 4:
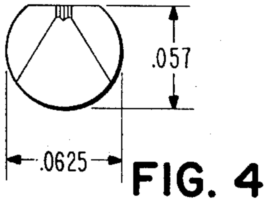
FIG. 4 is a lower end view of the bonding tip.
Figure 5:
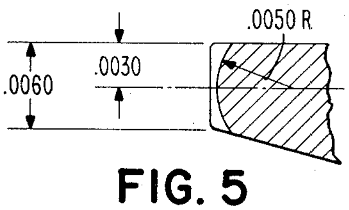
FIG. 5 is an enlarged side showing of the portion A of FIG. 3 of the bonding tip.
Figure 6:
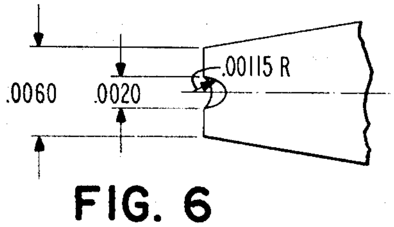
FIG. 6 is an enlarged front showing of the portion A of FIG. 3.

The device shown in FIG. 1 comprises a transducer 10 for converting electrical oscillations into ultrasonic vibrations. The transducer 10 is connected through a horn 11 to a bonding tip 12. The horn 11 is caused to vibrate in the direction indicated by the arrows or any other direction suitable to bonding. Opposite the tip 12 is a circuit board 13 having a conductive pad 14 etched thereon or equivalent device with pads or the like. A fine wire 15, as for example a 2.5 mil wire, is held by the end of tip 12 in contact with pad 14.

According to the instant invention, the bonding tips of the preferred embodiments are fabricated from No. 316 or 410 stainless steel powders. Ideally, the tips are formed from sintered blocks prepared from No. 316 stainless steel powder of 40 micron size. The as-sintered block has a tensile strength of approximately 8,000 pounds per square inch, a density of 7.25 grams per cubic centimeter and a Knoop hardness of about 250. Although the hardness for this material is quite low compared to the ceramic materials, the ductility and fatigue properties are much superior.

Briefly, the bonding tip fabricating process comprises compacting, sintering, grinding, grooving the tips, and heat treatment of the tips. The shape of the bonding tip is typically a long cylindrical shank with a tapered end and may have either a circular or square cross section. The dimensions of the tip are dependent upon frequency, wire size, and the wire density within the area where the bonding tip is being used for bonding purposes. An example of tip dimensions are shown in FIGS. 2 through 6. This particular tip is used for a specific application of bonding 2 to 3 mil wires within a high density maze. It should be noted that the tip dimensions and shape can vary substantially without affecting the bond characteristics.

The tip fabrication process is as follows. Basically, the starting material is 20 to 60 micron size powder of nominal purity. The materials can be stainless steel, monel or the like. The tip blank is fabricated by compacting and sintering to a cylindrical shape which is the same in diameter as the resultant tip. However, a compacted block may be formed from which the shank and tip can be machined. An example of sintering and heat treatment of a stainless steel blank is in accordance with the following steps of procedure:

*a.* Compacting stainless steel powders of about 20 to 60 microns in size at a pressure of 50 tons per square inch (Tsi). Other additive ingredients in addition to the metallic powders are ¾ percent lithium stearate and 0.15 percent graphite. The density of the as-compacted rods is about 6.45 gm/cc.

*b.* Burn off lubricants by subjecting to 1000° F in air for approximately 20 minutes.

*c.* Sinter the rods at 2350° F in dissociated ammonia ($NH_3$for about 60 minutes.

*d.* Repress the rods at 50 Tsi.

*e.* Heat treat the rods at 1800° F in an endo-thermal atmosphere (+54° F) for approximately 30 minutes followed by an air cooling, and then temper the rods at 400° F in air for approximately 30 minutes. The mechanical properties for the blanks are density 7.15 gm/cc; hardness 86 $R_B$ (Rockwell B); TRS (transverse rupture strength) 180,000 pounds per square inch.

The tips are then ground to final size and shape. Any suitable machining or grinding operation will enable the procurement of tips of desired size and shape. In this operation, an alignment feature consisting of a flat or hole in the tip is provided to facilitate location and holding of the tip within the ultrasonic bonding apparatus.

A groove may optionally be introduced into the tip by mechanical action caused by a forward and backward action of a tungsten wire on the flat tip end. By means of suitable fixturing, the depth and width of the groove can be controlled. Alternatively, the groove may be introduced by means of a grinding wheel charged with a diamond powder. Further, the tip can be grooved by a chemical-mechanical operation. The selection of a particular technique for grooving is dependent upon the desired reproducibility of the groove. In the preferred embodiment, the grinding wheel with charged diamond powder produced the most satisfactory result for the specific application of the bonding tips.

Following the grinding and grooving operations, the tips are then cleaned by dipping in a 10 – 15 percent sulfuric acid solution at 160° F for approximately 3 minutes followed by an immersion in a nitric (10 percent) – hydrofluoric (1 percent) acid solution at 140° F for about 1 minute. A thorough rinse in water follows the cleaning process.

Representative bonding tips were fabricated in accordance with the showings of FIG. 2 through FIG. 6 for experimentation purposes. The tip end is a 6 mil square flat with a 2 mil wide and 1 mil deep groove. Some tips were grooved with a 1.5 mil tungsten wire using a No. 9 diamond compound. Some tips were heat treated while for other tips the heat treatment was omitted. In other tip samples, the grooving was performed with a grinding wheel charged with diamond chips and then subjected to a heat treatment. In still other samples, the tips were heat treated first and then grooved with the grinding wheel charges with diamond chips. In all instances, the heat treated tips were chemically treated to remove surface contaminates. Experimental results indicate that the bonding tips which were not heat treated had a significantly greater wear and attendant chipping. The heat treated tips showed significant improvement in resistance to wear. The ultrasonic wire bonds made with the sintered metal bonding tips produced bonds having excellent pull strength characteristics and with minimal amounts of deviation.

While the invention has been particularly shown and described with reference to preferred embodiments thereof, it will be understood by those skilled in the art that the foregoing and other changes in form and details may be made without departing from the spirit and scope of the invention.

We claim:

1. A process for fabricating ultrasonic bonding tips comprising:

a. compacting stainless steel powders in the range of 20 to 60 micron size at a pressure in the range of 30 to 70 tons per square inch, b. subjecting the as-compacted rods to a temperature of approximately 1000° F in air for approximately 20 minutes, c. sintering the as-compacted rods at 2000° F to approximately 2350° in dissociated ammonia ($NH_3$) for a period of approximately 60 minutes, d. repressing the rods at a pressure of from 30 to 60 tons per square inch, e. heat treating the rods in the range of 1500° F to 2000° F in an endo-thermal atmosphere of 50° F to 60° F for a period of 20 to 40 minutes followed by an air colling, f. tempering the rods at 350° F to 450° F in air for approximately 30 minutes, g. grinding the as-compacted rods to final size and shape.

2. A process for fabricating ultrasonic bonding tips as defined in claim 1 further including the steps of dipping in a 10 – 15 percent sulfuric acid solution at 130° F to 170° F for a period of two to 5 minutes followed by an immersion in a nitric (8 – 12 percent) hydrofluoric (0.5 to 1.5 percent) acid solution at a range of 125° F to 150° F for approximately 1 minute which is followed by a thorough water rinse.

* * * * *